(12) United States Patent
Wang et al.

(10) Patent No.: US 11,711,890 B2
(45) Date of Patent: Jul. 25, 2023

(54) ASYMMETRIC BOARD

(71) Applicant: SHENZHEN KINWONG ELECTRONIC CO., LTD., Guangdong (CN)

(72) Inventors: Jun Wang, Guangdong (CN); Xiaoqing Chen, Guangdong (CN); Qian Chen, Guangdong (CN)

(\*) Notice: Subject to any disclaimer, the term of this patent is extended or adjusted under 35 U.S.C. 154(b) by 0 days.

(21) Appl. No.: 17/826,501

(22) Filed: May 27, 2022

(65) Prior Publication Data

US 2022/0386455 A1 Dec. 1, 2022

(30) Foreign Application Priority Data

May 27, 2021 (CN) .......................... 202121171453.2

(51) Int. Cl.
*H05K 1/02* (2006.01)
*H05K 1/14* (2006.01)

(52) U.S. Cl.
CPC ............ *H05K 1/0271* (2013.01); *H05K 1/144* (2013.01); *H05K 2201/0191* (2013.01); *H05K 2201/09036* (2013.01)

(58) Field of Classification Search
CPC ......... H05K 1/144; H05K 2201/09036; H05K 2201/0191; H05K 1/02; H05K 1/0271

USPC ....................................................... 174/255
See application file for complete search history.

(56) References Cited

FOREIGN PATENT DOCUMENTS

| CN | 104253127 B | 5/2017 |
|----|-------------|--------|
| CN | 111511129 B | 6/2021 |

*Primary Examiner* — Tremesha S Willis
(74) *Attorney, Agent, or Firm* — Brooks Kushman PC; John E. Nemazi

(57) ABSTRACT

The present application provides an asymmetric board, which includes the first master board, the second master board, and the insulating dielectric layer sandwiched between the first master board and the second master board, and the depth control grooves are disposed in the connection position between the units on the asymmetric board, and located on the surface of the second master board and extending a toward the side of the first master board, the depth control grooves provide space for the expansion of the second master board, reduce the stress of the units, and reduce the warping of the second master board. When the number of the depth control grooves in the first direction and/or the second direction is greater than 0, the depths of the depth control grooves increase by X from a center to an edge of the asymmetric board, and the X is greater than or equal to 0.

20 Claims, 8 Drawing Sheets

ASYMMETRIC BOARD

CROSS REFERENCE TO RELATED APPLICATION

The present application claims priority of Chinese patent application, with Application No. 202121171453.2, filed on May 27, 2021 to CNIPA, the entire content of which is incorporated herein by reference.

TECHNICAL FIELD

The present application relates to the technical field of circuit boards, and more particularly to an asymmetric board.

BACKGROUND

With the continuous development of technology of Printed Circuit Boards (PCB), since the existing asymmetric boards are formed by mixing different materials and/or asymmetric laminating, for example, an asymmetric board is formed by pressing a high-frequency core board and an FR4 core board, which is usually applied in the design of radar boards. The outer layer of the high-frequency core board can ensure high signal transmission efficiency and low loss.

The problem with this type of asymmetric board is that the high-frequency core board usually contains polytetrafluoroethylene (PTFE) material, and the coefficient of thermal expansion of the PTFE is large, and the product is delivered as a jointed board, and a connection position is provided between the units; the PCB board needs to be soldered by reflow soldering during assembly, and the temperature during the soldering process can reach 260° C. In the mixed pressing asymmetric laminating structure, the high-frequency core board itself is prone to warping after thermal compression bonding, further, during assembly, a more serious warping will be caused by thermal stress. Generally, the warping from the center to the edge of the jointed board is gradually worse, and accordingly, the warping of the units located at the edges is relatively worse. Due to the warping of the entire asymmetric board, virtual soldering and desoldering will occur after the PCB board is assembled, especially for the units located at the edge, which seriously affects the product assembly effect and product performance.

SUMMARY

An object of the present application is to provide an asymmetric board, in order to solve the technical problem that the edge of the asymmetric board existed is seriously wrapped.

An embodiment of the present application is achieved by providing an asymmetric board, which includes:

a first master board, including at least two first copper layers, and a first insulating layer sandwiched between two adjacent first copper layers;

a second master board, including at least two second copper layers, and a second insulating layer sandwiched between two adjacent second copper layers; wherein a coefficient of thermal expansion of a material of the second insulating layer is greater than that of the first insulating layer; and an insulating dielectric layer, provided between the first master board and the second master board;

wherein the asymmetric board is provided with a plurality of units, a connection area is arranged between the adjacent units, a connection position is arranged in the connection area, and the connection position is provided with depth control grooves extending from a surface of the second master board to the first master board;

the units are arranged into at least one row and at least one column respectively along a first direction and a second direction perpendicular to each other; when a number of the depth control grooves located in the connection area of a same row is n, and a number of the depth control grooves located in the connection area of a same column is m; the n and m are integers greater than or equal to 0; and when the n and/or m is greater than 0, depths of the depth control grooves in the first direction and/or the second direction increase by X from a center to an edge of the asymmetric board, and the X is greater than or equal to 0.

In one embodiment, when the n and/or m is less than 3, the depths of the depth control grooves in the first direction and/or the second direction of the units increase by the X from the center to the edge of the asymmetric board, and the X is equal to 0.

In one embodiment, when the n and/or m is not less than 3, the depths of the depth control grooves in the first direction and/or the second direction of the units increase by the X from the center to the edge of the asymmetric board, and the X is greater to 0.

In one embodiment, when the n<3, the depths of the depth control grooves are equal; when the n≥3, the depths of the depth control grooves are increased by the X from the center to the edge of the asymmetric board, and the X is greater to 0; and when the m<3, the depths of the depth control grooves are equal; when the m≥3, the depths of the depth control grooves are increased by the X from the center to the edge of the asymmetric board, and the X is greater to 0.

In one embodiment, a highest position of a bottom wall of each depth control groove is aligned to a side surface of the insulating dielectric layer facing the second master board; and a lowest position of the bottom wall of each depth control groove is aligned to a side surface of the insulating dielectric layer facing the first master board.

In one embodiment, each depth control groove is provided with a depth minimum value $H_{min}$=H1−H4+ΔX, and a depth maximum value $H_{max}$=H1−H4+H3−ΔX; or a surface of the second master board is provided with a solder resist layer, and the $H_{min}$=H1−H4+L'+ΔX; and the $H_{max}$=H1−H4+H3+L'−ΔX; wherein, the H1 represents a thickness of the second master board, the H3 represents a thickness of the insulating dielectric layer, the H4 represents a thickness of the second copper layer, the ΔX represents a precision tolerance of a mechanical depth control milling machine configured for forming the depth control grooves; and the L' represents a thickness of the solder resist layer.

In one embodiment, a longitudinal section of each depth control groove is rectangular or V-shaped.

In one embodiment, the second master board is double-layer board; each depth control groove is provided with a depth minimum value $H_{min}$H1−H4+ΔX, and a depth maximum value $H_{max}$=H1−H4+H3−ΔX; or a surface of the second master board is provided with a solder resist layer, and the $H_{min}$ H1−H4+L'+ΔX; and the $H_{max}$=H1−H4+H3+L'−ΔX; wherein, the H1 represents a thickness of the second master board, the H3 represents a thickness of the insulating dielectric layer, the H4 represents a thickness of the second copper layer, the ΔX represents a precision tolerance of a mechanical depth control milling machine configured for forming the depth control grooves; and the L' represents a thickness of the solder resist layer.

In one embodiment, when n<3, the depth of each depth control groove is greater than or equal to $H_{min}$ and less than or equal to $H_{max}$; and/or, when m<3, the depth of each depth control groove is greater than or equal to $H_{min}$ and less than or equal to $H_{max}$.

In one embodiment, when n≥3, a depth of a depth control groove at a most edge of the asymmetric board is the $H_{max}$, and a depth of a depth control groove at a center of the asymmetric board is the $H_{max}$; and/or, when m≥3, a depth of a depth control groove at a most edge of the asymmetric board is the $H_{max}$, and a depth of a depth control groove at a center of the asymmetric board is the $H_{max}$.

In one embodiment, when n≥3, the depths of the depth control grooves are in an arithmetic sequence from the center of the asymmetric board to the edge of any side thereof; and/or, when m≥3, the depths of the depth control grooves are in an arithmetic sequence from the center of the asymmetric board to the edge of any side thereof.

In one embodiment, when n≥3, a depth of a p-th depth control groove is equal to a depth of a n+1−p-th depth control groove, and the p is a positive integer less than or equal to the n; and/or, when m≥3, a depth of a q-th depth control groove is equal to a depth of a n+1−q-th depth control groove, and the q is a positive integer less than or equal to the m.

In one embodiment, the two adjacent units are connected by one or more connection positions, and each of the connection positions is provided with one or more of depth control grooves.

The beneficial effects of the asymmetric board provided by the embodiments of the present application are:

The asymmetric board provided by the embodiment of the present application includes the first master board, the second master board, and the insulating dielectric layer sandwiched between the first master board and the second master board, and the depth control grooves are disposed in the connection position between the units on the asymmetric board, and located on the surface of the second master board and extending a toward the side of the first master board, the depth control grooves provide space for the expansion of the second master board, reduce the stress of the units, and reduce the warping of the second master board. When the number of the depth control grooves in the first direction and/or the second direction is greater than 0, the depths of the depth control grooves increase by X from a center to an edge of the asymmetric board, and the X is greater than or equal to 0, for example, when the number of depth control grooves in the first direction/second direction of the asymmetric board is less than 3, the depth control grooves are equal, that is the X is equal to 0; when the number of depth control grooves is greater than or equal to 3, the depths of the depth control grooves in each connection position increases sequentially from the center to the edge of the asymmetric board, and the depths of the depth control grooves at the edge of the asymmetric board are larger, therefore, the improvement effect on warping is more obvious, and the warping of the edge of the asymmetric board is lower, and the flatness of the entire asymmetric board is within the acceptable range. Of course, the number of the depth control grooves in the above example may be less than 3, or greater than or equal to 3, which is only for the convenience of reflecting the improvement over the existing asymmetric board.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

Figure 1:
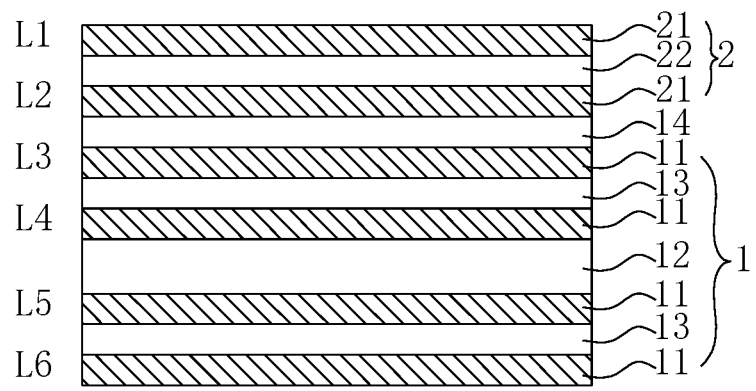
FIG. 1 is a laminating schematic view of an asymmetric board.

In the drawings, the reference signs are listing:
1—first master board; 11—first copper layer; 12—first insulating layer; 13—first prepreg/first insulating dielectric layer; 14—second prepreg/second insulating dielectric layer; 15—solder resist layer;
2—second master board; 21—second copper layer; 22—second insulating layer, 211—laying copper area;
30—connection area; 31—connection position;
4—asymmetric board; 41—unit; 410—unit molding edge; 42—edge; and
50—depth control groove.

DETAILED DESCRIPTION

In order to make the purpose, technical solutions and advantages of the present application more clearly understood, the present application will be described in further detail below with reference to the accompanying drawings and embodiments. It should be understood that the specific embodiments described herein are only used to explain the present application, but not to limit the present application.

It should be noted that when a component is referred to as being "fixed to" or "disposed on" another component, it can be directly or indirectly on the other component. When an element is referred to as being "connected to" another element, it can be directly or indirectly connected to the other element. The orientation or positional relationship indicated by the terms "upper", "lower", "left", "right", etc. is based on the orientation or positional relationship shown in the drawings, and is only for the convenience of description, rather than indicating or implying the referred device or elements must have a particular orientation, be constructed and operate in a particular orientation, and therefore should not be construed as a limitation of this patent. The terms "first" and "second" are only used for the purpose of description, and should not be understood as indicating or implying relative importance or implying indicating the number of technical features. "Plurality" means two or more, unless expressly specifically limited otherwise.

In order to illustrate the technical solutions described in the present application, a detailed description is given below with reference to the specific drawings and embodiments.

Referring to FIG. 1, an embodiment of the present application first provides an asymmetric board 4, which includes a first master board 1, a second master board 2, and at least one second insulating dielectric layer 14 sandwiched between the first master board and the second master board 2, the prepreg (B-stage) is a semi-cured state of the resin, under a condition of high temperature and high pressure, the resin in it softens and decreases in viscosity after being heated, and can flow after being melted. After a period of time, the resin in the semi-cured state absorbs heat and undergoes a polymerization reaction, the viscosity increases, and gradually solidifies into a C-stage resin, that is, the insulating dielectric layer between the two copper layers; the first master board 1 includes at least two first copper layers 11 and a first insulating layer 12 sandwiched between two adjacent first copper layers 11, and the second master board 2 includes at least two second copper layers 21 and a second insulating layer 22 sandwiched between two adjacent second copper layers 21.

The materials of the first insulating layer 12 and the second insulating layer 22 are different, so the coefficient of thermal expansions are different. In the embodiment, the coefficient of thermal expansion of the material of the second insulating layer 22 is greater than that of the material of the first insulating layer 12.

Figure 2:
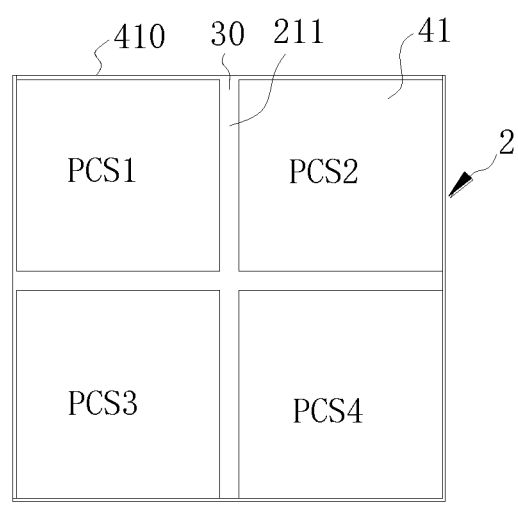
FIG. 2 is a schematic plan view of an asymmetric board on the side of a second master board.
Figure 3:
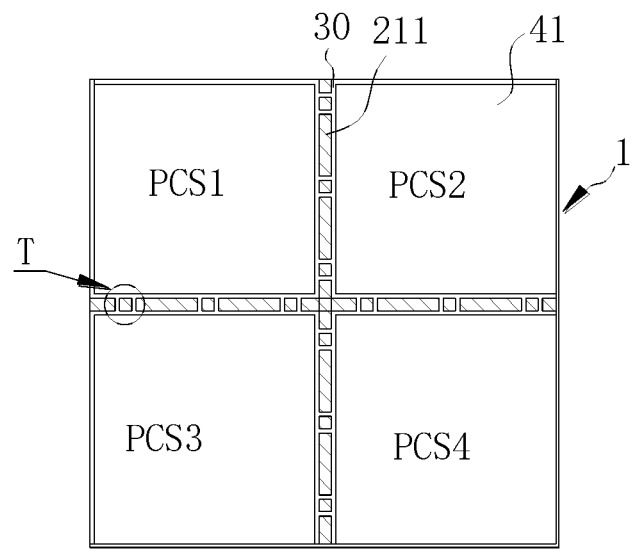
FIG. 3 is a schematic plan view of a first master board in an asymmetric board provided by the embodiment of the present application, which shows the first master board before the second thermal compression bonding.
Figure 4:
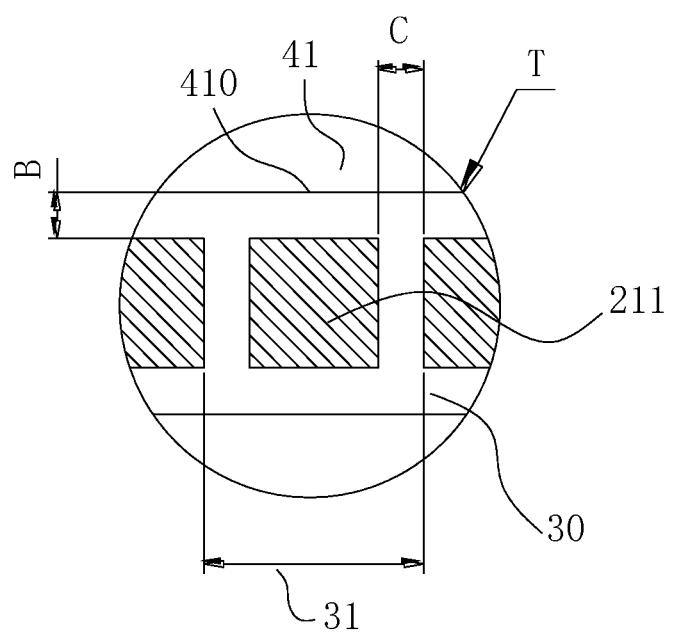
FIG. 4 is an enlarged view at part-T in FIG. 3.
Figure 5:
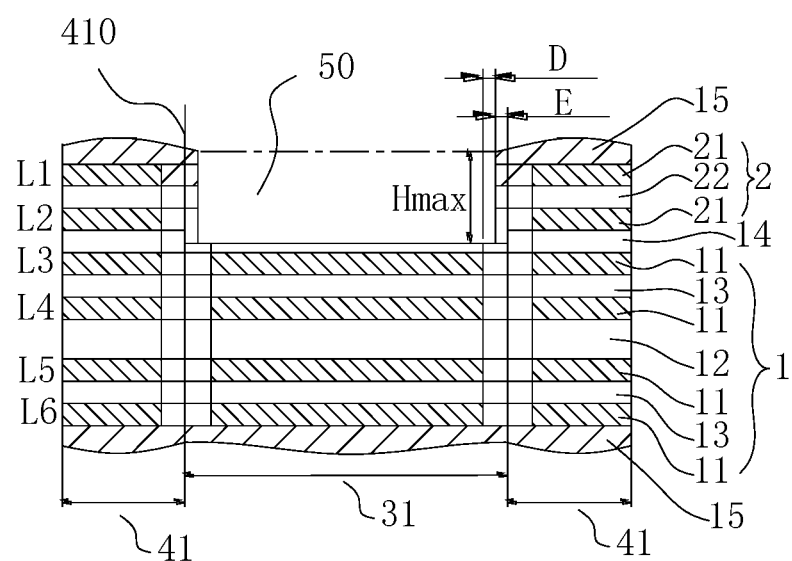
FIG. 5 to FIG. 7 show three kinds of structural schematic views of depth control grooves respectively.
Figure 6:
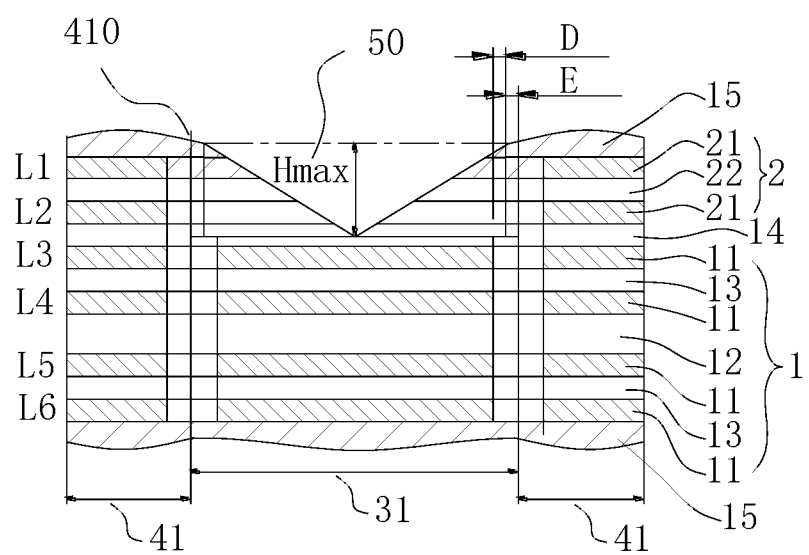
Figure 7:
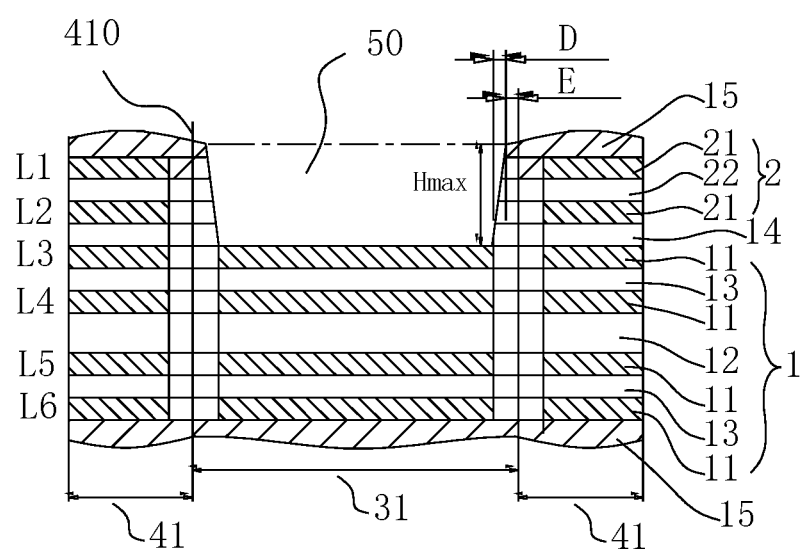

Each asymmetric board 4 includes a plurality of units 41 (in FIGS. 2 and 3, PCS1 to PCS4 form an asymmetric board 4); as shown in FIGS. 4-5 and 7, a connection area 30 is provided between the units 41 (one unit 41 and an adjacent unit 41), and the connection area 30 is provided thereon with a connection position 31, and the unit 41 and the adjacent unit 41 are connected to each other through the connection position 31, referring to FIGS. 5 to 7. It can be understood that the connection area 30 is an additional area provided on the outer periphery of the units 41 for convenience in the fabrication process. Each unit 41 is an asymmetric circuit board unit.

Referring to FIGS. 5 to 7, in the connection area 31, the surface of the second master board 2 is provided with the depth control groove(s) 50 extending toward the direction of the first master board 1.

Figure 9:
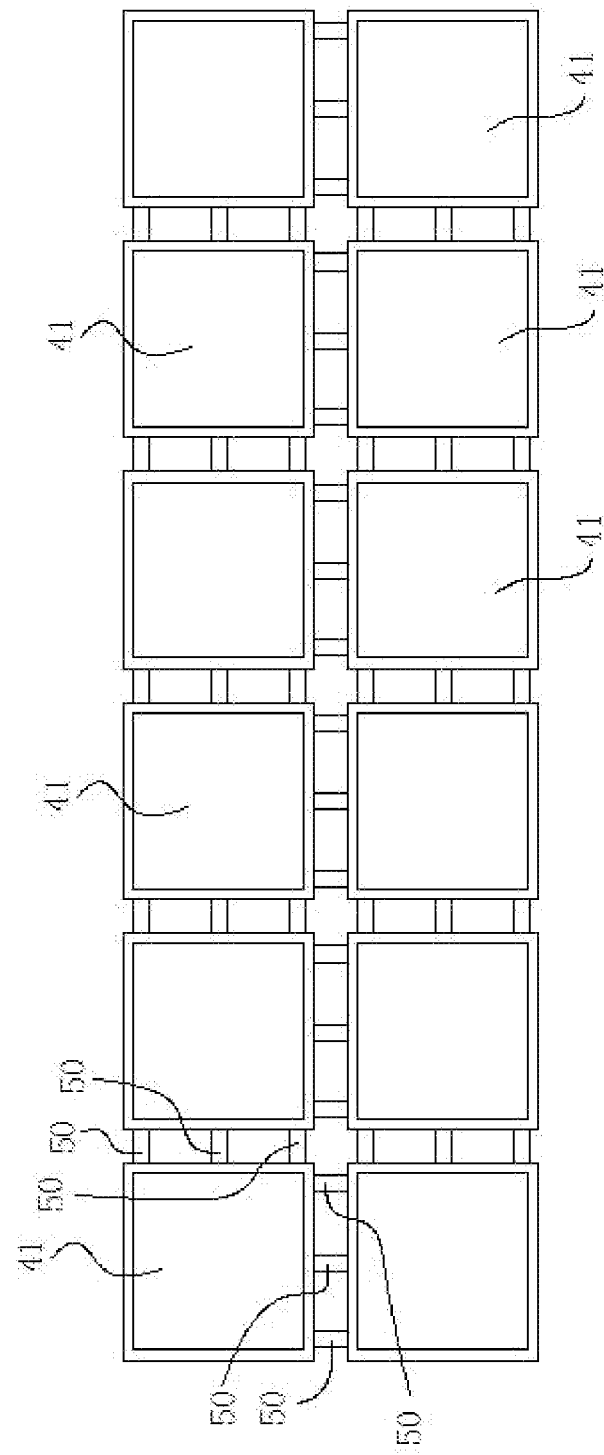
FIG. 9 is schematic view of two distributions of depth control grooves.
Figure 10:
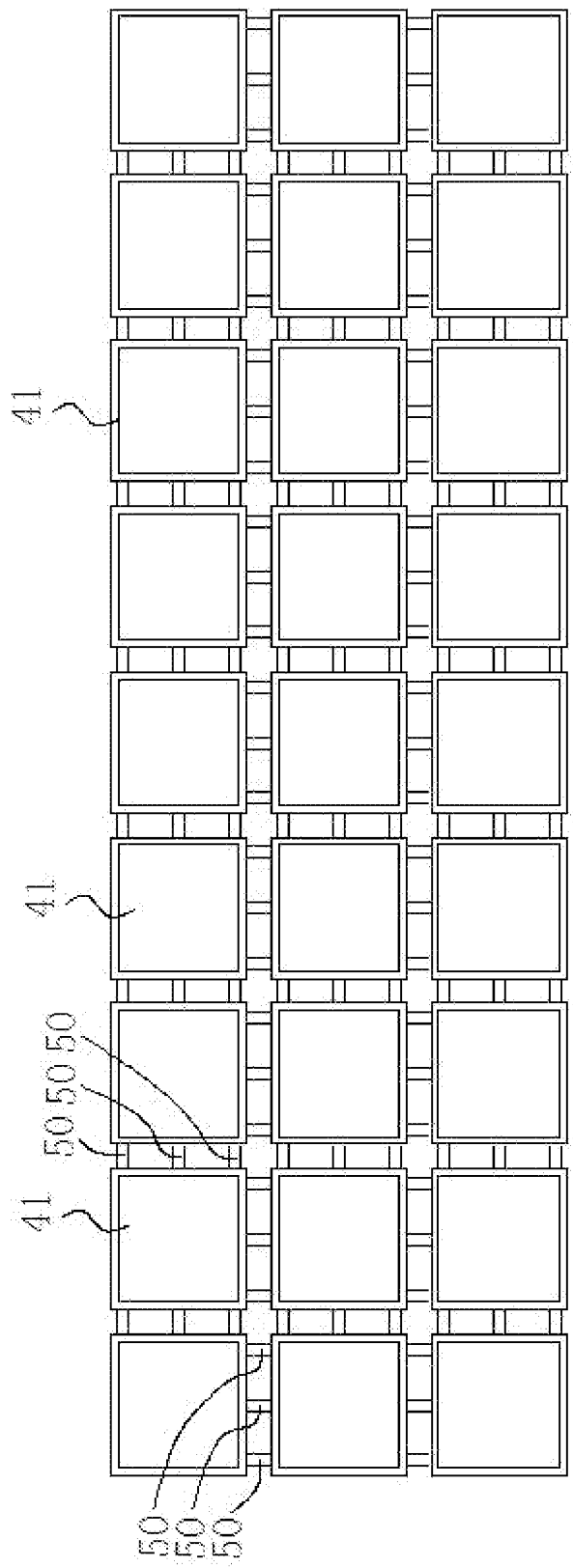
FIG. 10 is a schematic view of two distributions of depth control grooves.

Referring to FIGS. 9 and 10, the units 41 in each asymmetric board 4 are arranged according to a first direction (eg row direction) and a second direction (eg column direction) perpendicular to each other, and arranged in at least one row and at least one column, the connection areas 30 are arranged in at least one row and/or at least one column, and the number of the depth control grooves 50 in the connection area 30 located in the same row is n, and the number of the depth control grooves 50 in the connection area 30 in the same column is m; when n<3, the depths of the depth control grooves 50 are equal, when n≥3, the depths of the depth control grooves 50 increase sequentially from the center to the edge of the asymmetric board 4; when m<3, the depths of the depth control grooves 50 are equal, when m≥3, the depths of the depth control grooves 50 increase sequentially from the center to the edge of the asymmetric board 4. In addition, the limitation of the number 3 is only to better illustrate the better solution of the present application. In an actual product, when n and/or m can be equal to 3, 4, 5 or a larger number, the depths of the depth control grooves 50 can also be maintained to be equal, and when n and/or m are greater than 3, 4, 5 or more, the depth of the depth control grooves 50 increases sequentially from the center to the edge of the asymmetric board 4.

Figure 8:
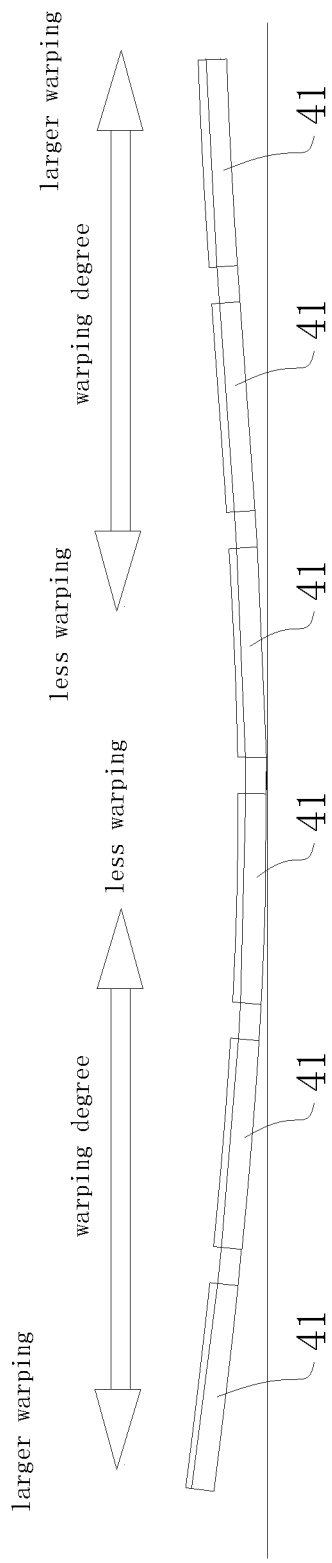
FIG. 8 is a warping schematic view of an asymmetric board.

Specifically, referring to FIGS. 1 and 8 in combination, in the asymmetric board, on the one hand, since the materials of the first insulating layer 12 in the first master board 1 and the second insulating layer 22 in the second master board 2 are different, there is a difference in the coefficient of thermal expansion between the two, and it is easy to warp to the side with the larger coefficient of thermal expansion after being heated; on the other hand, the thickness of the first master board 1 and the thickness of the second master board 2 may also be different due to the number of layers (referring to the number of copper layers), etc., which may lead to a worse warping.

Generally, the asymmetric board 4 is warped toward the side of the second master board 2 after the first master board 1 and the second master board 2 are thermally compression bonded, and the warping degree of the edge is greater than that of the center. Therefore, in the present application, the depths of the deep control grooves 50 decrease from the edge to the center based on the warping degree, and the depth of the deep control groove 50 is larger at the position with a larger warping. It can be understood that, if the warping of the edge of the asymmetric board 4 is smaller than the warping of the center under special circumstances, the depths of the depth control grooves 50 change according to the warping change trend.

The asymmetric board provided by the embodiment of the present application includes the first master board 1 and the second master board 2 that are pressed against each other, the depth control grooves 50 extending toward the first master board 1 are provided on the surface of the second master board 2 and located in the connection area 31 between the units 41. The depth control grooves 50 can make room for the expansion and shrinkage of the second master board 2 in the subsequent fabricating process such as the mounting process, thereby reducing the stress of units 41 on one side of the second master board, and reducing the warping of the second master board 2, and when the depth control grooves 50 in the first direction/second direction of the asymmetrical board 4 are less than 3, the depths of the depth control grooves 50 are equal; and when the number of depth control grooves 50 in the first direction/second direction of the asymmetric board 4 is greater than or equal to 3, the depth of each depth control groove 50 increases sequentially from the center to the edge of the asymmetric board 4. The depth control groove 50 at the edge of 4 is larger, so the effect of improving the warping is more obvious, so that the warping degree of the edge of the asymmetric board 4 is lower, the flatness of the asymmetric board 4 is within the acceptable range, and the rigidity of the connecting positions 31 in the asymmetric board 4 can also be ensured, so that each unit 41 is not easily broken before mounting. In addition, the limitation of the number 3 is only to better illustrate the better solution of the present application. In an actual product, when n and/or m can be equal to 3, 4, 5 or a larger number, the depths of the depth control grooves 50 can also be maintained to be equal, and when n and/or m are greater than 3, 4, 5 or more, the depth of the depth control grooves 50 increases sequentially from the center to the edge of the asymmetric board 4.

Each connection area 30 can be provided with one connection position 31. Of course, according to specific needs, for example, when the side length of the unit 41 is relatively large, it is also possible to have a plurality of connection positions 31 in each connection area 30.

One depth control groove 50 can be provided in each connection position 31, and similarly, a plurality of depth control grooves 50 can be provided in each connection position 31. Referring to FIGS. 9 and 10, three depth control grooves 50 are formed in each connection area 30, wherein, for the sake of clarity, the three connection positions 31 in each connection area 30 are omitted in FIGS. 9 and 10.

In one embodiment, the first master board 1 may be a double-layer board, a four-layer board, a six-layer board, or the like. The second master board 2 may also be a double-layer board, a four-layer board, or the like. As shown in FIG. 1, in this embodiment, the second master board 2 is a double-layered board.

In one embodiment, the second master board 2 is a high-frequency core board, and the material of the second insulating layer 22 is PTFE. The first master board 1 can be an FR4 core board, and the material of the first insulating layer 12 is epoxy resin. Of course, it is not limited to this. According to specific needs, the second master board 2 can be other types of boards, and the second insulating layer 22 can be made of other materials, which are only examples here.

Hereinafter, the second master board 2 is a double-layer board and the first master board 1 is a four-layer board as an example for description, as shown in FIG. 1. Then, each unit 41 on the asymmetric board is a six-layer asymmetric circuit board.

As shown in FIG. 1, starting from a side of the second master board 2, each copper layer is marked as L1 layer, L2 layer . . . , L6 layer. In the embodiment, the L1 layer is the second copper layer 21 of the second master board 2 on the side away from the first master board 1, and the L2 layer is the second copper layer 21 of the second master board 2 approaching to the first master board 1. The L3 to L6 layers are the first copper layers 11 of the first master board 1, wherein the L6 layer is the first copper layer 11 of the outer layer of the first master board 1 on the side away from the second master board 2. The L1 layer and the L6 layer are respectively protective layers.

Here, the steps of fabricating the first master board 1 are briefly described as follows:

Cutting: cutting an entire large copper clad laminate into a required work board according to design requirements, and pass the cut work board through the tunnel furnace to reduce the internal stress of the board; the work board includes an insulating layer and copper layers on both sides;

Transferring an inner layer pattern of the work board: coating a layer of photosensitive polymer on the copper layer on at least one side of the work board, irradiating the layer of photosensitive polymer with an exposure machine (such as a 4CCD alignment lens semi-automatically), and transferring the inner layer pattern required by the first master board 1 to the photosensitive polymer;

Developing: placing the work board covered with photosensitive polymer into the developer, the photosensitive polymer that has not undergone polymerization reaction is developed, and the photosensitive polymer that undergoes polymerization reaction will not be developed (in negative Photopolymer as an example), the copper material that does not need to be retained on the copper layer of the work board is exposed;

Etching: etching the exposed copper material by an etching solution, and the copper material protected by the photosensitive polymer is retained to obtain the desired inner layer pattern;

Stripping: stripping the photosensitive polymer on the copper layer by a stripping liquid to obtain the first sub-board; the copper layers on both sides of the first sub-board are the first copper layers 11, respectively, and the first insulating layer 12 is located between the first copper layers 11;

Optical inspecting: optically inspecting the completed first sub-board to confirm the quality;

Punching, use a punching machine to punch out multiple positioning holes on the first sub-board (for example, 8 positioning holes, including 4 fusion positioning holes and 4 riveting positioning holes);

Browning: browning the first copper layers 11 on the opposite sides of the first sub-board with a browning liquid to roughen the surface of the copper conductor;

First thermal compression bonding (correspondingly, based on the time sequence, the aforementioned thermal compression bonding between the first master board 1 and the second master board 2 is named second thermal compression bonding): laminating the insulating dielectric layer (herein, the first insulating dielectric layer 13, as shown in FIGS. 1, 5 and 7) on both sides of the browned first sub-board 11 according to the laminating requirements of the customer, and placing copper foils on the top and bottom of the first insulating dielectric layer 13 respectively, and then performing thermal compression bonding in a high temperature environment. Optionally, the first maser board 1 can also directly use multiple first sub-boards 11 to laminate at least one first insulating dielectric layer 13 according to the laminating requirements of the customer, and then thermal compression bonding them to form a first master board 1 with a specified number of layers.

Processing procedures after the first thermal compression bonding: including target shooting, edge milling, drilling, copper sinking, board powering, outer circuit, inner layer etching, and inner layer automatic optical inspecting, etc.

In the first master board 1, the connection areas 30 of the inner layer copper layers (the L3 layer to the L5 layer) are respectively provided with a laying copper area 211. That is, except for one first copper layer 11 (the L6 layer) that is farthest from the second master board 2, there are laying copper areas 211 in the connection areas 30 on other first copper layers 11 (L3 layer to L5 layer), as shown in FIGS. 3 and 4.

Correspondingly, in the above-mentioned step of transferring the inner layer pattern of the working board, the inner layer pattern obtained is that on the first copper layer 11 of the first sub-board, a laying copper area 211 is formed in an area corresponding to the connection area 30 between the unit 41 and the adjacent unit 41. In the above circuit fabricating steps, on one of the copper foils, a laying copper area 211 is formed in the area corresponding to the connection area 30 between the unit 41 and the adjacent unit 41, the copper foil is used as the L3 layer, and on the second copper layer 21 of the other outer layer, corresponding board edge patterns such as tool holes are made, and the copper foil is used as the L6 layer.

Optionally, as shown in FIGS. 3 and 4, the laying copper areas 211 between the corresponding units 41 and the adjacent unit 41 are arranged at intervals, and the arranging of the laying copper areas 211 can improve the strength of the first master board 1, thereby reducing the warping of the first sub-board and the first master board 1.

As shown in FIGS. 3 and 4, in the connection area 30 on the inner copper layer of the second master board 2, the distance between the laying copper area 211 and the unit molding edge 410 is B, and B≥0.2 mm. The purpose of the arrangement is that, due to the alignment error in the subsequent thermal compression bonding step and the subsequent milling finished board step to divide the multiple units 41 of the asymmetric board 4, since the milling machine has a precision tolerance, and the distance between the laying copper area 211 and the unit molding edge 410 is greater than or equal to 0.2 mm to prevent the edge of the unit 41 from exposing the inner layer of copper after the board is divided; since the connection area 30 between the unit 41 and the adjacent unit 41 is partially removed, the rest is the connection position 31, as shown in FIG. 4, when the subsequent unit 41 and the adjacent unit 41 are divided, the milling board position may correspond to a part of the laying copper area 211. Therefore, in order to prevent the inner layer copper layers from being exposed between the units 41 in the asymmetric board 4 after the board divided, the distance between the two adjacent laying copper areas 211 is C, and the C≥0.2 mm.

The steps of fabricating the second master board 2 are briefly described as follows:

Cutting: cutting an entire large copper clad laminate into a required work board according to design requirements, and pass the cut work board through the tunnel furnace to reduce the internal stress of the board;

Transferring of an inner layer pattern of the work board: coating a layer of photosensitive polymer on the copper layer on at least one side of the work board, irradiating the layer of photosensitive polymer with an exposure machine (such as a 4CCD alignment lens semi-automatically), and transferring the inner layer pattern required by the second master board 2 to the photosensitive polymer;

Developing: placing the work board covered with photosensitive polymer into the developer, the photosensitive polymer that has not undergone polymerization reaction is developed, and the photosensitive polymer that undergoes polymerization reaction will not be developed (in negative Photopolymer as an example), the copper material that does not need to be retained on the copper layer of the work board is exposed;

Etching: etching the exposed copper material by an etching solution, and the copper material protected by the photosensitive polymer is retained to obtain the desired patterns on the copper layers on at least one side;

Stripping: stripping the photosensitive polymer on the copper layer by a stripping liquid to obtain the second sub-board; the copper layers on both sides of the second sub-board 2 are the second copper layers 21 respectively, and the second insulating layer 22 is located between the second copper layers 21;

For the second master board 2 of the double-layer board, in the fabricating step of the inner layer pattern, on one of the second copper layers 21 (the L1 layer), only the board edge patterns corresponding to the tool holes and the like required subsequently are fabricated, and another second copper layer 21 (the L2 layer) is used as the inner layer copper layer and the inner layer circuit pattern is normally fabricated according to the above steps. So far, the obtained inner layer circuit patterns are the inner layer circuit pattern of the unit 41 on the second copper layer 21 (L2 layer) as the inner layer copper layer, and board edge patterns such as tool holes on the second copper layer 21 (the L1 layer) as the outer copper layer.

Optical inspecting: optically inspecting the completed second sub-board to confirm the quality;

Punching, use a punching machine to punch out multiple positioning holes on the second sub-board;

Browning: Browning is performed on the surface of the second sub-board with a browning solution to roughen the surface of the copper conductor.

Then, the first master board 1 and the second master board 2 are laminated together by at least one second prepreg 14, and the second thermal compression bonding is performed.

After the second thermal compression bonding, which also needs to include processing of drilling, copper sinking, board thickening, outer layer circuit fabricating, and automatic optical inspection, etc. In particular, after the outer layer circuit is fabricated, only the circuit pattern corresponding to the unit 41 remains on the L1 layer, and there is no copper on the connection positions 31 of the L1 layer and the L2 layer of the second master board 2.

In one embodiment, both sides of the asymmetric board 4 are further provided with solder resist layers 15, and the solder resist layers 15 can expose the positions on the L1 layer and the L6 layer where electronic components need to be soldered, while protecting other areas.

The depth control groove 50 is provided to penetrate the second master board 2 in the thickness direction but not reach the copper layer (the layer L3) on the first master board 1 on the side closest to the second master board 2. That is, each depth control groove 50 is obtained by completely removing the thickness of the second master board 2 and completely retaining the first master board 1, so that the warping deformation of the second master board 2 caused by thermal expansion can be improved to the maximum degree, while the warping deformation of the first master board 1 is improved to the minimum degree (only in terms of the function of the depth control grooves 50), and finally the warping deformation of the first master board 1 and the second master board 2 can be roughly approximated, such that the obtained asymmetric board 4 as a whole does not experience significant warping or even warping. Correspondingly, the depth of the depth control groove 50 has a maximum value $H_{max}$, at this time, the bottom wall of the depth control groove 50 is aligned to the surface of the L3 layer facing the L2 layer. That is, the bottom wall of the depth control groove 50 is aligned to the surface of the second insulating dielectric layer 14 facing the L3 layer. The depth of the depth control groove 50 has a minimum value $H_{min}$, at this time, the bottom wall of the depth control groove 50 is aligned to the surface of the L2 layer facing the L3 layer. That is, the bottom wall of the depth control groove 50 is aligned to the surface of the second insulating dielectric layer 14 facing the L2 layer.

On this basis, when the second insulating dielectric layer 14 between the first master board 1 and the second master board 2 is completely penetrated by the depth control groove 50 in the thickness direction, the warping deformation of the second insulating dielectric layer 14 is improved to the greatest extent, so that it is possible to further avoid causing unbalance of warping deformation between the first master board 1 and the second master board 2. Therefore, the greater the depths of the depth control grooves 50, the greater the balance effect on the warping deformation between the first master board 1 and the second master board 2. In this way, the larger depth of the depth control grooves 50 located at the edges in the row direction and the column direction can significantly improve the problem of serious warping of the edge of the asymmetric board 4.

$H_{max}$ and $H_{min}$ are different depending on the method of forming the depth control grooves 50.

In one embodiment, the depth control grooves 50 can be realized by a mechanical depth controlling method, and the specific working method is a tool rotary milling method, specifically, after the cylindrical multi-blade cutter rotates at high speed around a straight line perpendicular to the surface of the asymmetric substrate board, which travels along the depth direction of the depth control groove 50 to mill out the unwanted material, and the desired pattern of the depth control groove 50 can be obtained by further traveling along the surface of the asymmetric substrate board. As shown in FIG. 5, in the embodiment, the longitudinal section of the depth control groove 50 is rectangular, and the inner side wall of the depth control groove 50 is perpendicular to the bottom wall thereof.

In this method, the minimum depth value of the depth control groove 50 is $H_{min}$=H1−H4+L'+ΔX, and the maximum depth value of the depth control groove 50 is $H_{max}$=H1−H4+H3+L'−ΔX; wherein, H1 represents the thickness of the second master board 2, it can be understood as the sum of the thicknesses of the second copper layers 21 and the second insulating layers 22, H3 represents the thickness of the second prepreg 14 (after the second thermal compression bonding), and H4 represents the thickness of the second copper layer 21 (the layer L1) of the outer layer of the second master board 2, the ΔX represents a precision tolerance of a depth control milling machine; and the L' represents a thickness of the solder resist layer 15 of the second master board 2.

Taking the above six-layer board as an example, H1 is 0.186 mm, the thickness H4 of the L1 layer is 0.018 mm, L' is 0.03 mm, H3 is 0.08 mm, ΔX is 0.05 mm; then, the $H_{min}$ is 0.223 mm, and the $H_{max}$ is 0.278 mm.

It can be understood that if there is no solder resist layer 15 on the asymmetric board 4, or the solder resist layer 15 has not been formed when the depth control groove 50 is formed, the depth of the depth control groove 50 does not need to consider the thickness of the solder resist layer 15, the minimum depth of the depth control groove 50 is $H_{min}$=H1−H4+ΔX, and the maximum depth of the depth control groove 50 is $H_{max}$=H1−H4+H3−ΔX.

In one embodiment, the depth control grooves 50 can be realized by another mechanical depth controlling method, that is, a V-cut depth control milling machine is used to perform V-cut depth control milling, and the specific working method is V-shaped cutter cutting method, in particular a plurality of V-shaped cutters travel along the surface of the asymmetric board 4 and cut off the unwanted material. The V-shaped cutter can travel along a straight line parallel to the surface of the asymmetric substrate board, or it can rotate around the straight line parallel to the surface of the asymmetric substrate board and then cut across the surface of the asymmetric substrate board. As shown in FIG. 6, the longitudinal section of the depth control groove 50 obtained in this method is inversely tapered (V-shaped), and the bottom dimension of the depth control groove 50 is smaller than the upper dimension.

In this method, the minimum depth value of the depth control groove 50 is $H_{min}$=H1−H4+L'+ΔX', and the maximum depth value of the depth control groove 50 is $H_{max}$=H1−H4+H3+L'−ΔX'; wherein, H1 represents the thickness of the second master board 2, H3 represents the thickness of the second prepreg 14 (after the second thermal compression bonding), and H4 represents the thickness of the second copper layer 21 (the layer L1) of the outer layer of the second master board 2, the ΔX' represents a precision tolerance of the V-cut depth control milling machine; and the L' represents a thickness of the solder resist layer 15 of the second master board 2.

Taking the above six-layer board as an example, H1 is 0.186 mm, the thickness H4 of the L1 layer is 0.018 mm, L' is 0.03 mm, H3 is 0.08 mm, ΔX' is 0.025 mm; then, the $H_{min}$ is 0.223 mm, and the $H_{max}$ is 0.253 mm.

It can be understood that if there is no solder resist layer 15 on the asymmetric board 4, or the solder resist layer 15 has not been formed when the depth control groove 50 is formed, the depth of the depth control groove 50 does not need to consider the thickness of the solder resist layer 15, the minimum depth of the depth control groove 50 is $H_{min}$=H1−H4+ΔX', and the maximum depth of the depth control groove 50 is $H_{max}$=H1−H4+H3−ΔX'.

In one embodiment, the depth control grooves 50 can also be realized by a laser method. The difference from the above two mechanical fabrication methods is that under certain parameter conditions, the laser emitted by the laser machine can only ablate the non-metallic dielectric layers without damaging the copper layers. Therefore, $H_{max}$ does not need to consider the precision tolerance of the laser machine, and only when the second master board 2 is a double-layer board, the laser method can be used to completely remove the part of the second master board 2 in the connection position 31, since before forming the depth control grooves 50, the connection positions 31 on the L1 layer and the L2 layer are free of copper. As shown in FIG. 7, the upper dimension of the depth control groove 50 formed in this way is larger than the bottom dimension, and is generally in the shape of an inverted trapezoid.

In this method, the minimum depth value of the depth control groove 50 is $H_{min}$=H1−H4+L'+ΔX'', and the maximum depth value of the depth control groove 50 is $H_{max}$=H1−H4+H3+L'; wherein, H1 represents the thickness of the second master board 2, H3 represents the thickness of the second prepreg 14 (after the thermal compression bonding), and H4 represents the thickness of the second copper layer 21 (the layer L1) of the outer layer of the second master board 2, the ΔX'' represents a precision tolerance of the laser machine; and the L' represents a thickness of the solder resist layer 15 of the second master board 2.

Taking the above six-layer board as an example, H1 is 0.186 mm, the thickness H4 of the L1 layer is 0.018 mm, L' is 0.03 mm, H3 is 0.08 mm, ΔX' is 0.025 mm; then, the $H_{min}$ is 0.223 mm, and the $H_{max}$ is 0.278 mm.

It can be understood that if there is no solder resist layer 15 on the asymmetric board 4, or the solder resist layer 15 has not been formed when the depth control groove 50 is formed, the depth of the depth control groove 50 does not need to consider the thickness of the solder resist layer 15, the minimum depth of the depth control groove 50 is $H_{min}$H1−H4+ΔX'', and the maximum depth of the depth control groove 50 is $H_{max}$=H1−H4+H3.

In one embodiment, as shown in FIGS. 5 to 7, the distance that the groove edge of the depth control groove 50 exceeds the laying copper area 211 in the connection position 31 of the inner layer copper layer on the first master board 1 is D, and the D≥0.075 mm. The purpose of this arrangement is to avoid exposing the inner layer copper on the second master board 2 when the board is divided among the multiple units 41 on the asymmetric board 4.

In one embodiment, as shown in FIGS. 5 to 7, the distance between the edge of the depth control groove 50 (the V-shaped and inverted trapezoidal depth control groove 50 refers to the edge of the upper end) and the unit molding edge 410 of the unit 41 is E, and the E≥0.075 mm. Due to the misalignment between the depth control milling machine and the asymmetric board 4 when forming the depth control groove 50, this arrangement can prevent the inner wall of the depth control groove 50 from affecting the units 41, especially for the rectangular depth control groove 50.

When n is less than 3 and m is less than 3, the depths of the depth control grooves 50 can be any value in the closed interval from $H_{min}$ to $H_{max}$, such as the maximum value, the minimum value, or other values between the maximum value and the minimum value. In order to ensure the effect of stress relief of the depth control groove 50, the depth of the depth control groove 50 should be increased as much as possible. Therefore, although the number of the deep control grooves 50 in the row direction or the column direction is only one or two, the maximum depth of the deep control grooves 50 can also be taken.

In one embodiment, when n≥3, from the center to the edge of any side of the asymmetric board 4, the difference between the depths of two adjacent depth control grooves 50 may be equal or unequal. When m≥3, from the center to the edge of any side of the asymmetric board 4, the difference between the depths of two adjacent depth control grooves 50 may be equal or unequal. Obviously, in the above embodiment, the value 3 can also be 4, 5, 6 or greater, that is, this embodiment can also be implemented when n/m≥4, 5, 6 or greater.

In one embodiment, when n≥3 and n is an even number, in the first direction, the depths of the first depth control groove 50 to the n/2-th depth control groove 50 present a decreasing arithmetic progression, and the depths of the n/2+1-th depth control groove 50 to the n-th depth control groove 50 present an increasing arithmetic sequence. When m≥3, and m is an even number, in the first direction, the depths of the first depth control groove 50 to the m/2-th depth control groove 50 present a decreasing arithmetic progression, and the depths of the m/2+1-th depth control groove 50 to the m-th depth control groove 50 present an increasing arithmetic sequence. Obviously, in the above embodiment, the value 3 can also be 4, 5, 6 or greater, that is, this embodiment can also be implemented when n/m≥5, 6 or greater.

In one embodiment, when n≥3 and n is an odd number, in the first direction, the depths of the first depth control groove 50 to the (n+1)/2-th depth control groove 50 present a decreasing arithmetic progression, and the depths of the (n+1)/2-th depth control groove 50 to the n-th depth control groove 50 present an increasing arithmetic sequence. when m≥3 and m is an odd number, in the first direction, the depths of the first depth control groove 50 to the (m+1)/2-th depth control groove 50 present a decreasing arithmetic progression, and the depths of the (m+1)/2-th depth control groove 50 to the m-th depth control groove 50 present an increasing arithmetic sequence. Obviously, in the above embodiment, the value 3 can also be 4, 5, 6 or greater, that is, this embodiment can also be implemented when n/m≥4, 5, 6 or greater.

In one embodiment, the depth of the p-th depth control groove 50 is equal to the depth of the n+1-p-th depth control grooves 50, where p≤n. The depth of the q-th depth control groove 50 is equal to the depth of the n+1-q-th depth control groove 50, where q≤n. The purpose of such arrangement is that from the center to the opposite side edges of the asymmetric board 4, the depths of the depth control grooves 50 are symmetrical, which is beneficial to ensure that the warping at symmetrical parts on the asymmetric board 4 with respect to the center are the same.

In one embodiment of the present application, there are 2×1 units 41 in the jointed board 4, there is no connection area 30 in the row direction, and the connection area 30 is one column. If there are five depth control grooves 50 in the connection area 30 of the column, the depth of the depth control groove 50 located at the center (the third) is the smallest, which can be $H_{min}$, and the depths of the depth control grooves 50 located at the edges of both sides (the first and fifth) are the largest, which can be $H_{max}$, and the depths of the second and fourth depth control grooves 50 are between $H_{min}$ and $H_{max}$.

In the following, it is illustrated that each connection area 30 is provided with one connection position 31 and each connection position 31 is provided with one depth control groove 50 as an example.

In one embodiment of the present application, 2×2 units 41 are provided in the jointed board 4, the connection areas 30 are arranged in one row and one column, and the number of depth control grooves 50 in the connection areas 30 of the row is 2, the number of depth control grooves 50 in the connection areas 30 of the column is 2. Then, in the row direction, the depths of the two depth control grooves 50 are equal, and any value in the closed interval from $H_{min}$ to $H_{max}$ can be selected, such as the maximum value, the minimum value, or other values between the maximum value and the minimum value; in the column direction, the depths of the two depth control grooves 50 are equal, and any value in the closed interval from $H_{min}$ to $H_{max}$ can be selected, such as the maximum value, the minimum value, or other values between the maximum value and the minimum value.

In one embodiment of the present application, 3×3 units 41 are arranged in the jointed board 4, the connection areas 30 are arranged in two rows and two columns, and the number of depth control grooves 50 in each row of connection areas 30 is three. The number of depth control grooves 50 in each column of connection areas 30 is three. Then, on any row, the depth of the depth control groove 50 located in the middle is less than the depth of the two depth control grooves 50 on both sides, wherein the depth of the depth control groove 50 located in the middle can be $H_{min}$, and the depth of the two depth control grooves 50 located on both sides can be $H_{max}$. The same goes for any column.

In one embodiment of the present application, 6×2 units 41 are arranged in the jointed board 4, the connection areas 30 are arranged in one row and five columns, and the number of depth control grooves 50 in the row of connection areas 30 is 6, and the number of depth control grooves 50 in each column of the connected the areas 30 is two.

Then, in the row direction, the depths of the two (the third and the fourth) depth control grooves 50 located in the middle to the depth control grooves 50 on both sides increase in turn, wherein the depth of the two (the third and the fourth) depth control grooves located in the middle is $H_{min}$, the depth of the two outermost (the first and the sixth) depth control grooves 50 can be $H_{max}$, and the depth of the second and fifth depth control grooves 50 are between $H_{min}$ and $H_{max}$.

The depths of the two depth control grooves 50 in each row are the same, which can be the $H_{min}$, or the $H_{max}$, or any values between the $H_{min}$ and the $H_{max}$. Further, the depths of the depth control grooves 50 in different rows can be the same or different. For example, the depth control grooves 50 in different rows are also arranged in an increasing manner from the center to the edge. The depths of the two depth control grooves 50 in the third row are the minimum, that is, the $H_{min}$, the depths of the two depth control grooves 50 in the first and fifth columns are the maximum, that is, the $H_{max}$, while the depths of the two depth control grooves 50 in the second and fourth columns is between the $H_{min}$ and the $H_{max}$.

In one embodiment of the present application, 9×3 units 41 are arranged in the jointed board 4, the connection areas 30 are arranged in two rows and eight columns, and the number of depth control grooves 50 in the connection areas 30 of each row is 9, and the number of depth control grooves 50 in the connection areas 30 of each column is three.

Therefore, in each row, the depths of the first depth control groove 50 to the fifth depth control groove 50 decrease sequentially, and the depths of the fifth depth control groove 50 to the ninth depth control groove 50 increase sequentially. The depth of the fifth depth control groove 50 can be the $H_{min}$, the depth of the first and ninth depth control grooves 50 can be the $H_{max}$, and the depths of other depth control grooves 50 are between the $H_{min}$ and the $H_{max}$.

Further, the depths of the two depth control grooves 50 located in the same column in different rows can be equal. For example, the depths of the first depth control grooves 50 in the two rows can be equal, the depths of the second depth control grooves 50 in the two rows can be equal . . . , and the depths of the ninth depth control grooves 50 in the two rows can be equal.

In each row, the depth control groove 50 located in the center (the second) is the minimum, for example, the $H_{min}$, and the depths of the two (first and third) depth control grooves 50 located on both sides are the maximum, for example, the $H_{max}$.

In the following, three connection positions 31 are provided in each connection area 30 and one depth control groove 50 is provided in each connection position 31 as an example for description.

As shown in FIG. 9, in one embodiment of the present application, 6×2 units 41 are arranged in the jointed board 4, the connection areas 30 are arranged in one row and five columns, and the number of depth control grooves 50 in the connection areas 30 of the row is 18, and the number of the depth control grooves 50 in the connection areas 30 of each column is 6.

Then, in the row direction, the depths of the two (the ninth and the tenth) depth control grooves 50 located in the middle to the depth control grooves 50 on both sides increase sequentially, wherein the two (the ninth and the tenth) depth control grooves 50 located in the middle are the $H_{min}$, the depth of the two outermost (the first and eighteenth) depth control grooves 50 can be the $H_{max}$, and the depths of the other depth control grooves 50 are between the $H_{min}$ and the $H_{max}$.

In each column, the depths of the two (the third and the fourth) depth control grooves 50 located in the middle to the depth control grooves 50 on both sides increase sequentially, wherein the depths of the two (the third and the fourth) depth control grooves 50 located in the middle are the $H_{min}$, the depth of the two outermost (the first and the sixth) depth control grooves 50 can be the $H_{max}$, and the depths of the other depth control grooves 50 are between the $H_{min}$ and the $H_{max}$.

As shown in FIG. 10, In one embodiment of the present application, 9×3 units 41 are arranged in the jointed board 4, the connection areas 30 are arranged in two rows and eight columns, and the number of depth control grooves 50 in the connection areas 30 of each row is 27, and the number of depth control grooves 50 in the connection areas 30 of each column is 9.

Then, in each row, the depths of the first depth control groove 50 to the fourteenth depth control groove 50 decrease sequentially, and the depths of the fourteenth depth control groove 50 to the twenty-seventh depth control groove 50 increase sequentially. The depth of the fourteenth depth control groove 50 can be the $H_{min}$, the depth of the first and twenty-seventh depth control grooves 50 can be the $H_{max}$, and the depths of other depth control grooves 50 are between the $H_{min}$ and the $H_{max}$.

Further, the depths of the two depth control grooves 50 located in the same column in different rows can be equal. For example, the depths of the first depth control grooves 50 in the two rows can be equal, the depths of the second depth control grooves 50 in the two rows can be equal . . . , and the depths of the twenty-seventh depth control grooves 50 in the two rows can be equal.

In each row, the depths of the first depth control groove 50 to the fifth depth control groove 50 decrease sequentially, and the depths of the fifth depth control groove 50 to the ninth depth control groove 50 increase sequentially. The depth of the fifth depth control groove 50 can be the $H_{min}$, the depth of the first and ninth depth control grooves 50 may be the $H_{max}$, and the depths of other depth control grooves 50 are between the $H_{min}$ and the $H_{max}$.

The above descriptions are only preferred embodiments of the present application and are not intended to limit the present application. Any modifications, equivalent replacements and improvements made within the principles of the present application shall be included within the protection of the present application.

Aspect:

Aspect 1, an asymmetric board, comprising:

a first master board, comprising at least two first copper layers, and a first insulating layer sandwiched between two adjacent first copper layers;

a second master board, comprising at least two second copper layers, and a second insulating layer sandwiched between two adjacent second copper layers; wherein a coefficient of thermal expansion of a material of the second insulating layer is greater than that of the first insulating layer; and an insulating dielectric layer, provided between the first master board and the second master board;

wherein the asymmetric board is provided with a plurality of units, a connection area is arranged between the adjacent units, a connection position is arranged in the connection area, and the connection position is provided with depth control grooves extending from a surface of the second master board to the first master board;

the units are arranged into at least one row and at least one column respectively along a first direction and a second direction perpendicular to each other; when a number of the depth control grooves located in the connection area of a same row is n, and a number of the depth control grooves located in the connection area of a same column is m; the n and m are integers greater than or equal to 0; and when the n and/or m is greater than 0, depths of the depth control grooves in the first direction and/or the second direction increase by X from a center to an edge of the asymmetric board, and the X is greater than or equal to 0.

Aspect 2, the asymmetric board according to aspect 1, wherein when the n and/or m is less than 3, the depths of the depth control grooves in the first direction and/or the second direction of the units increase by the X from the center to the edge of the asymmetric board, and the X is equal to 0.

Aspect 3, the asymmetric board according to any one of the preceding aspects, wherein when the n and/or m is not less than 3, the depths of the depth control grooves in the first direction and/or the second direction of the units increase by the X from the center to the edge of the asymmetric board, and the X is greater to 0.

Aspect 4, the asymmetric board according to any one of the preceding aspects, wherein when the n<3, the depths of the depth control grooves are equal; when the n≥3, the depths of the depth control grooves are increased by the X from the center to the edge of the asymmetric board, and the X is greater to 0; and when the m<3, the depths of the depth control grooves are equal; when the m≥3, the depths of the depth control grooves are increased by the X from the center to the edge of the asymmetric board, and the X is greater to 0.

Aspect 5, the asymmetric board according to any one of the preceding aspects, wherein a highest position of a bottom wall of each depth control groove is aligned to a side surface of the insulating dielectric layer facing the second master board; and a lowest position of the bottom wall of each depth control groove is aligned to a side surface of the insulating dielectric layer facing the first master board.

Aspect 6, the asymmetric board according to any one of the preceding aspects, wherein each depth control groove is provided with a depth minimum value $H_{min}=H1-H4+\Delta X$, and a depth maximum value $H_{max}=H1-H4+H3-\Delta X$; or a surface of the second master board is provided with a solder resist layer, and the $H_{min}=H1-H4+L'+\Delta X$; and the $H_{max}=H1-H4+H3+L'-\Delta X$; wherein, the H1 represents a thickness of the second master board, the H3 represents a thickness of the insulating dielectric layer, the H4 represents a thickness of the second copper layer, the $\Delta X$ represents a precision tolerance of a mechanical depth control milling machine configured for forming the depth control grooves; and the L' represents a thickness of the solder resist layer.

Aspect 7, the asymmetric board according to any one of the preceding aspects, wherein a longitudinal section of each depth control groove is rectangular or V-shaped.

Aspect 8, the asymmetric board according to any one of the preceding aspects, wherein the second master board is double-layer board; each depth control groove is provided with a depth minimum value $H_{min}H1-H4+\Delta X$, and a depth maximum value $H_{max}=H1-H4+H3-\Delta X$; or a surface of the second master board is provided with a solder resist layer, and the $H_{min}$ $H1-H4+L'+\Delta X$; and the $H_{max}=H1-H4+H3+L'-\Delta X$; wherein, the H1 represents a thickness of the second master board, the H3 represents a thickness of the insulating dielectric layer, the H4 represents a thickness of the second copper layer, the $\Delta X$ represents a precision tolerance of a mechanical depth control milling machine configured for forming the depth control grooves; and the L' represents a thickness of the solder resist layer.

Aspect 9, the asymmetric board according to any one of the preceding aspects, wherein when n<3, the depth of each depth control groove is greater than or equal to $H_{min}$ and less than or equal to $H_{max}$; and/or, when m<3, the depth of each depth control groove is greater than or equal to $H_{min}$ and less than or equal to $H_{max}$.

Aspect 10, the asymmetric board according to any one of the preceding aspects, wherein when n≥3, a depth of a depth control groove at a most edge of the asymmetric board is the $H_{max}$, and a depth of a depth control groove at a center of the asymmetric board is the $H_{max}$; and/or, when m≥3, a depth of a depth control groove at a most edge of the asymmetric board is the $H_{max}$, and a depth of a depth control groove at a center of the asymmetric board is the $H_{max}$.

Aspect 11, the asymmetric board according to any one of the preceding aspects, wherein when n≥3, the depths of the depth control grooves are in an arithmetic sequence from the center of the asymmetric board to the edge of any side thereof; and/or, when m≥3, the depths of the depth control grooves are in an arithmetic sequence from the center of the asymmetric board to the edge of any side thereof.

Aspect 12, the asymmetric board according to any one of the preceding aspects, wherein when n≥3, a depth of a p-th depth control groove is equal to a depth of an n+1−p-th depth control groove, and the p is a positive integer less than or equal to the n; and/or, when m≥3, a depth of a q-th depth control groove is equal to a depth of a n+1−q-th depth control groove, and the q is a positive integer less than or equal to the m.

Aspect 13, the asymmetric board according to any one of the preceding aspects, wherein the two adjacent units are connected by one or more connection positions, and each of the connection positions is provided with one or more of depth control grooves.

What is claimed is:

1. An asymmetric board, comprising:
   a first master board, comprising at least two first copper layers, and a first insulating layer sandwiched between two adjacent first copper layers;
   a second master board, comprising at least two second copper layers, and a second insulating layer sandwiched between two adjacent second copper layers; wherein a coefficient of thermal expansion of a material of the second insulating layer is greater than that of the first insulating layer; and
   an insulating dielectric layer, provided between the first master board and the second master board;
   wherein the asymmetric board is provided with a plurality of units, a connection area is arranged between the adjacent units, a connection position is arranged in the connection area, and the connection position is provided with depth control grooves extending from a surface of the second master board to the first master board;
   the units are arranged into at least one row and at least one column respectively along a first direction and a second direction perpendicular to each other; when a number of the depth control grooves located in the connection area of a same row is n, and a number of the depth control grooves located in the connection area of a same column is m; the n and m are integers greater than or equal to 0; and
   when the n and/or m is greater than 0, depths of the depth control grooves in the first direction and/or the second direction increase by X from a center to an edge of the asymmetric board, and the X is greater than or equal to 0.

2. The asymmetric board according to claim 1, wherein when the n and/or m is less than 3, the depths of the depth control grooves in the first direction and/or the second direction of the units increase by the X from the center to the edge of the asymmetric board, and the X is equal to 0.

3. The asymmetric board according to claim 1, wherein when then and/or m is not less than 3, the depths of the depth control grooves in the first direction and/or the second direction of the units increase by the X from the center to the edge of the asymmetric board, and the X is greater to 0.

4. The asymmetric board according to claim 1, wherein when the n<3, the depths of the depth control grooves are equal; when the n≥3, the depths of the depth control grooves are increased by the X from the center to the edge of the asymmetric board, and the X is greater to 0; and
   when the m<3, the depths of the depth control grooves are equal; when the m≥3, the depths of the depth control grooves are increased by the X from the center to the edge of the asymmetric board, and the X is greater to 0.

5. The asymmetric board according to claim 1, wherein a highest position of a bottom wall of each depth control groove is aligned to a side surface of the insulating dielectric layer facing the second master board; and a lowest position of the bottom wall of each depth control groove is aligned to a side surface of the insulating dielectric layer facing the first master board.

6. The asymmetric board according to claim 5, wherein each depth control groove is provided with a depth minimum value $H_{min}=H1-H4+\Delta X$, and a depth maximum value $H_{max}=H1-H4+H3-\Delta X$; or a surface of the second master board is provided with a solder resist layer, and the $H_{min}$ $H1-H4+L'+\Delta X$; and the $H_{max}=H1-H4+H3+L'-\Delta X$; wherein, the H1 represents a thickness of the second master board, the H3 represents a thickness of the insulating dielectric layer, the H4 represents a thickness of the second copper layer, the $\Delta X$ represents a precision tolerance of a mechanical depth control milling machine configured for forming the depth control grooves; and the L' represents a thickness of the solder resist layer.

7. The asymmetric board according to claim 6, wherein a longitudinal section of each depth control groove is rectangular or V-shaped.

8. The asymmetric board according to claim 5, wherein the second master board is double-layer board; each depth control groove is provided with a depth minimum value $H_{min}=H1-H4+\Delta X$, and a depth maximum value $H_{max}=H1-H4+H3-\Delta X$; or a surface of the second master board is provided with a solder resist layer, and the $H_{min}=H1-H4+L'+\Delta X$; and the $H_{max}=H1-H4+H3+L'-\Delta X$; wherein, the H1 represents a thickness of the second master board, the H3 represents a thickness of the insulating dielectric layer, the H4 represents a thickness of the second copper layer, the $\Delta X$ represents a precision tolerance of a mechanical depth control milling machine configured for forming the depth control grooves; and the L' represents a thickness of the solder resist layer.

9. The asymmetric board according to claim 6, wherein when n<3, the depth of each depth control groove is greater than or equal to $H_{min}$ and less than or equal to $H_{max}$; and/or, when m<3, the depth of each depth control groove is greater than or equal to $H_{min}$ and less than or equal to $H_{max}$.

10. The asymmetric board according to claim 6, wherein when n≥3, a depth of a depth control groove at a most edge of the asymmetric board is the $H_{max}$, and a depth of a depth control groove at a center of the asymmetric board is the $H_{max}$; and/or, when m≥3, a depth of a depth control groove at a most edge of the asymmetric board is the $H_{max}$, and a depth of a depth control groove at a center of the asymmetric board is the $H_{max}$.

11. The asymmetric board according to claim 1, wherein when n≥3, the depths of the depth control grooves are in an arithmetic sequence from the center of the asymmetric board to the edge of any side thereof; and/or, when m≥3, the depths of the depth control grooves are in an arithmetic sequence from the center of the asymmetric board to the edge of any side thereof.

12. The asymmetric board according to claim 1, wherein when n≥3, a depth of a p-th depth control groove is equal to a depth of a n+1−p-th depth control groove, and the p is a positive integer less than or equal to the n; and/or, when m≥3, a depth of a q-th depth control groove is equal to a depth of a n+1−q-th depth control groove, and the q is a positive integer less than or equal to the m.

13. The asymmetric board according to claim 1, wherein the two adjacent units are connected by one or more connection positions, and each of the connection positions is provided with one or more of depth control grooves.

14. The asymmetric board according to claim 7, wherein when n<3, the depth of each depth control groove is greater than or equal to $H_{min}$ and less than or equal to $H_{max}$; and/or, when m<3, the depth of each depth control groove is greater than or equal to $H_{min}$ and less than or equal to $H_{max}$.

15. The asymmetric board according to claim 8, wherein when n<3, the depth of each depth control groove is greater than or equal to $H_{min}$ and less than or equal to $H_{max}$; and/or, when m<3, the depth of each depth control groove is greater than or equal to $H_{min}$ and less than or equal to $H_{max}$.

16. The asymmetric board according to claim 7, wherein when n≥3, a depth of a depth control groove at a most edge of the asymmetric board is the $H_{max}$, and a depth of a depth control groove at a center of the asymmetric board is the $H_{max}$; and/or, when m≥3, a depth of a depth control groove at a most edge of the asymmetric board is the $H_{max}$, and a depth of a depth control groove at a center of the asymmetric board is the $H_{max}$.

17. The asymmetric board according to claim 8, wherein when n≥3, a depth of a depth control groove at a most edge of the asymmetric board is the $H_{max}$, and a depth of a depth control groove at a center of the asymmetric board is the $H_{max}$; and/or, when m≥3, a depth of a depth control groove at a most edge of the asymmetric board is the $H_{max}$, and a depth of a depth control groove at a center of the asymmetric board is the $H_{max}$.

18. The asymmetric board according to claim 2, wherein when n≥3, the depths of the depth control grooves are in an arithmetic sequence from the center of the asymmetric board to the edge of any side thereof; and/or, when m≥3, the depths of the depth control grooves are in an arithmetic sequence from the center of the asymmetric board to the edge of any side thereof.

19. The asymmetric board according to claim 3, wherein when n≥3, the depths of the depth control grooves are in an arithmetic sequence from the center of the asymmetric board to the edge of any side thereof; and/or, when m≥3, the depths of the depth control grooves are in an arithmetic sequence from the center of the asymmetric board to the edge of any side thereof.

20. The asymmetric board according to claim 4, wherein when n≥3, the depths of the depth control grooves are in an arithmetic sequence from the center of the asymmetric board to the edge of any side thereof; and/or, when m≥3, the depths of the depth control grooves are in an arithmetic sequence from the center of the asymmetric board to the edge of any side thereof.

* * * * *

UNITED STATES PATENT AND TRADEMARK OFFICE
CERTIFICATE OF CORRECTION

PATENT NO. : 11,711,890 B2
APPLICATION NO. : 17/826501
DATED : July 25, 2023
INVENTOR(S) : Jun Wang et al.

Page 1 of 1

It is certified that error appears in the above-identified patent and that said Letters Patent is hereby corrected as shown below:

On the Title Page

After:
(72) Inventors: Jun Wang, Guangdong (CN); Xiaoqing Chen, Guangdong (CN); Qian Chen, Guangdong (CN)
Insert:
-- (73) Assignee: SHENZHEN KINWONG ELECTRONIC CO., LTD. Guangdong (CN) --.

In the Claims

Column 18, Lines 49-50, Claim 3:
After "wherein when"
Delete "then" and
Insert -- the $n$ --.

Signed and Sealed this
Thirteenth Day of February, 2024

Katherine Kelly Vidal
*Director of the United States Patent and Trademark Office*